(12) United States Patent
Toyota et al.

(10) Patent No.: US 11,274,249 B2
(45) Date of Patent: Mar. 15, 2022

(54) PHOSPHOR AND SEMICONDUCTOR LIGHT EMITTING DEVICE USING THE SAME

(71) Applicant: Panasonic Intellectual Property Management Co., Ltd., Osaka (JP)

(72) Inventors: Kei Toyota, Osaka (JP); Shinnosuke Akiyama, Okayama (JP); Riho Moriyama, Osaka (JP)

(73) Assignee: Panasonic Intellectual Property Management Co. Ltd., Osaka (JP)

( * ) Notice: Subject to any disclaimer, the term of this patent is extended or adjusted under 35 U.S.C. 154(b) by 16 days.

(21) Appl. No.: 17/060,170

(22) Filed: Oct. 1, 2020

(65) Prior Publication Data

US 2021/0108139 A1    Apr. 15, 2021

(30) Foreign Application Priority Data

Oct. 9, 2019    (JP) .............................. JP2019-185669

(51) Int. Cl.
*H01L 33/50* (2010.01)
*H01L 33/32* (2010.01)
*C09K 11/77* (2006.01)
*H01L 33/00* (2010.01)

(52) U.S. Cl.
CPC ...... *C09K 11/7792* (2013.01); *H01L 33/0004* (2013.01); *H01L 33/502* (2013.01); *H01L 33/32* (2013.01); *H01L 33/504* (2013.01); *H01L 2933/0041* (2013.01)

(58) Field of Classification Search
CPC ... H01L 33/0004; H01L 33/502; H01L 33/32; H01L 33/504; H01L 2933/0041; C09K 11/7792; C09K 11/777
See application file for complete search history.

(56) References Cited

U.S. PATENT DOCUMENTS

| 9,287,241 B2* | 3/2016 | Kim .................... H01L 25/0753 |
| 2001/0001207 A1 | 5/2001 | Shimizu et al. |
| 2004/0000868 A1 | 1/2004 | Shimizu et al. |
| 2004/0004437 A1 | 1/2004 | Shimizu et al. |
| 2004/0090180 A1 | 5/2004 | Shimizu et al. |
| 2004/0222435 A1 | 11/2004 | Shimizu et al. |
| 2005/0280357 A1 | 12/2005 | Shimizu et al. |
| 2007/0114914 A1 | 5/2007 | Shimizu et al. |

(Continued)

FOREIGN PATENT DOCUMENTS

| JP | 10-242513 | 9/1998 |
| JP | 2900928 B | 6/1999 |

(Continued)

*Primary Examiner* — Mark W Tornow
(74) *Attorney, Agent, or Firm* — Wenderoth, Lind & Ponack, L.L.P.

(57) ABSTRACT

A phosphor is represented by a chemical formula of $Lu_{(3-x-z)}Mg_xZn_yAl_{(5-y)}O_{12}:Ce_z$, in which in a case where z is in a range of $0.01 \leq z \leq 0.03$, x and y respectively satisfy $0 < x \leq 1.4$ and $0 < y \leq 1.4$, in a case where z is in a range of $0.03 < z \leq 0.06$, x and y respectively satisfy $y < 0.2$ and $0.1 \leq x \leq 1.4$, $x < 0.2$ and $0.1 \leq y \leq 1.4$, or $x = 0.2$ and $y = 0.2$, in a case where z is in a range of $0.06 < z \leq 0.09$, x and y respectively satisfy $y < 0.2$ and $0.1 \leq x < 1.4$, or $x < 0.2$ and $0.1 \leq y < 1.4$, and in a case where z is in a range of $0.09 < z \leq 0.12$, x and y respectively satisfy $y < 0.2$ and $0.1 \leq x < 0.9$, or $x < 0.2$ and $0.1 \leq y < 0.9$.

3 Claims, 8 Drawing Sheets

(56) References Cited

U.S. PATENT DOCUMENTS

| | | |
|---|---|---|
| 2007/0159060 A1 | 7/2007 | Shimizu et al. |
| 2008/0138918 A1 | 6/2008 | Shimizu et al. |
| 2009/0315014 A1 | 12/2009 | Shimizu et al. |
| 2009/0315015 A1 | 12/2009 | Shimizu et al. |
| 2009/0316068 A1 | 12/2009 | Shimizu et al. |
| 2010/0001258 A1 | 1/2010 | Shimizu et al. |
| 2010/0006819 A1 | 1/2010 | Shimizu et al. |
| 2010/0019224 A1 | 1/2010 | Shimizu et al. |
| 2010/0019270 A1 | 1/2010 | Shimizu et al. |
| 2010/0117516 A1 | 5/2010 | Shimizu et al. |
| 2010/0264841 A1 | 10/2010 | Shimizu et al. |
| 2010/0264842 A1 | 10/2010 | Shimizu et al. |
| 2011/0053299 A1 | 3/2011 | Shimieu et al. |
| 2011/0062864 A1 | 3/2011 | Shimizu et al. |
| 2011/0235309 A1* | 9/2011 | Miki .................. C09K 11/7734 362/97.2 |
| 2011/0297990 A1 | 12/2011 | Shimizu et al. |
| 2012/0212123 A1 | 8/2012 | Sakuta et al. |
| 2012/0267999 A1 | 10/2012 | Sakuta et al. |
| 2012/0286646 A1 | 11/2012 | Sakuta et al. |
| 2014/0084323 A1 | 3/2014 | Shimizu et al. |

FOREIGN PATENT DOCUMENTS

| | | |
|---|---|---|
| WO | 2011/105571 | 9/2011 |
| WO | 2012/046642 | 4/2012 |
| WO | 2019/150747 | 8/2019 |

\* cited by examiner

(Table 1)

| FIG. 2A | | FIG. 2B | |
|---|---|---|---|
| $2\theta$/deg | Relative intensity | $2\theta$/deg | Relative intensity |
| 18.3 | 4151 | 18.1 | 1723 |
| 21.2 | 1327 | 21.0 | 368 |
| 28.1 | 3520 | 27.8 | 1517 |
| 30.0 | 1674 | 29.8 | 2391 |
| 33.7 | 10000 | 33.4 | 10000 |
| 37.0 | 2036 | 36.7 | 1916 |
| 41.6 | 2478 | 41.2 | 2326 |
| 43.0 | 583 | 42.7 | 424 |
| 47.0 | 2696 | 46.7 | 2233 |
| 52.1 | 545 | 52.9 | 1431 |
| 53.3 | 1896 | 53.2 | 0 |
| 55.6 | 2937 | 55.3 | 2588 |
| 56.8 | 1240 | 56.4 | 529 |
| 57.9 | 2022 | 57.6 | 2217 |
| 61.3 | 722 | 60.8 | 192 |
| 62.3 | 1007 | 61.9 | 792 |

FIG. 6

(Table 2)

| | Lu(3-x-z)MgxZnyAl(5-y)O12:Cez | | | Blending amount /g | | | | | | Peak wavelength (nm) | C | Determination | A/B | Determination | Comprehensive determination |
|---|---|---|---|---|---|---|---|---|---|---|---|---|---|---|---|
| | x | y | z | Lutetium oxide Lu2O3 | Magnesium oxide MgO | Zinc oxide ZnO | Alumina Al2O3 | Cerium oxide CeO2 | Barium fluoride BaF2 | | | | | | |
| Example 1 | 0.1 | 0.01 | 0.01 | 186.85 | 1.34 | 0.27 | 84.80 | 0.57 | 3.18 | 515 | 1.10 | α | 0.95 | α | α |
| Example 2 | 0.4 | 0.01 | 0.01 | 167.46 | 5.37 | 0.27 | 84.80 | 0.57 | 3.00 | 511 | 1.07 | α | 0.96 | α | α |
| Example 3 | 0.9 | 0.01 | 0.01 | 135.13 | 12.09 | 0.27 | 84.80 | 0.57 | 2.71 | 519 | 1.09 | α | 0.95 | α | α |
| Example 4 | 1.4 | 0.01 | 0.01 | 102.80 | 18.81 | 0.27 | 84.80 | 0.57 | 2.41 | 510 | 1.06 | α | 0.97 | α | α |
| Example 5 | 0.01 | 0.1 | 0.01 | 192.67 | 0.13 | 2.71 | 83.27 | 0.57 | 3.25 | 518 | 1.09 | α | 0.97 | α | α |
| Example 6 | 0.01 | 0.4 | 0.01 | 192.67 | 0.13 | 10.85 | 78.17 | 0.57 | 3.28 | 517 | 1.11 | α | 0.96 | α | α |
| Example 7 | 0.01 | 0.9 | 0.01 | 192.67 | 0.13 | 24.42 | 69.67 | 0.57 | 3.34 | 515 | 1.07 | α | 0.96 | α | α |
| Example 8 | 0.01 | 1.4 | 0.01 | 192.67 | 0.13 | 37.99 | 61.18 | 0.57 | 3.40 | 519 | 1.06 | α | 0.97 | α | α |
| Example 9 | 0.2 | 0.2 | 0.01 | 180.39 | 2.69 | 5.43 | 81.57 | 0.57 | 3.14 | 519 | 1.04 | α | 0.95 | α | β |
| Example 10 | 0.2 | 0.9 | 0.01 | 180.39 | 2.69 | 24.42 | 69.67 | 0.57 | 3.23 | 518 | 1.04 | β | 0.94 | β | β |
| Example 11 | 0.9 | 0.2 | 0.01 | 135.13 | 12.09 | 5.43 | 81.57 | 0.57 | 2.73 | 516 | 1.03 | β | 0.95 | β | β |
| Example 12 | 0.4 | 1.4 | 0.01 | 167.46 | 5.37 | 37.99 | 61.18 | 0.57 | 3.17 | 517 | 1.02 | β | 0.93 | β | β |
| Example 13 | 0.4 | 0.4 | 0.01 | 167.46 | 5.37 | 10.85 | 78.17 | 0.57 | 3.05 | 517 | 1.03 | β | 0.94 | β | β |
| Example 14 | 1.4 | 0.4 | 0.01 | 102.80 | 18.81 | 10.85 | 78.17 | 0.57 | 2.45 | 515 | 1.05 | α | 0.94 | α | α |
| Example 15 | 0.1 | 0.01 | 0.03 | 185.56 | 1.34 | 0.27 | 84.80 | 1.72 | 3.18 | 512 | 1.08 | α | 0.95 | α | α |
| Example 16 | 0.4 | 0.01 | 0.03 | 166.16 | 5.37 | 0.27 | 84.80 | 1.72 | 3.00 | 510 | 1.09 | α | 0.95 | α | α |
| Example 17 | 0.9 | 0.01 | 0.03 | 133.84 | 12.09 | 0.27 | 84.80 | 1.72 | 2.70 | 509 | 1.07 | α | 0.96 | α | α |
| Example 18 | 1.4 | 0.01 | 0.03 | 101.51 | 18.81 | 0.27 | 84.80 | 1.72 | 2.41 | 508 | 1.08 | α | 0.95 | α | α |
| Example 19 | 0.01 | 0.1 | 0.03 | 191.38 | 0.13 | 2.71 | 83.27 | 1.72 | 3.24 | 508 | 1.06 | α | 0.97 | α | α |
| Example 20 | 0.01 | 0.4 | 0.03 | 191.38 | 0.13 | 10.85 | 78.17 | 1.72 | 3.28 | 510 | 1.07 | α | 0.95 | α | α |
| Example 21 | 0.01 | 0.9 | 0.03 | 191.38 | 0.13 | 24.42 | 69.67 | 1.72 | 3.34 | 513 | 1.08 | α | 0.98 | α | α |
| Example 22 | 0.01 | 1.4 | 0.03 | 191.38 | 0.13 | 37.99 | 61.18 | 1.72 | 3.40 | 511 | 1.10 | α | 0.97 | α | α |
| Example 23 | 0.2 | 0.2 | 0.03 | 179.09 | 2.69 | 5.43 | 81.57 | 1.72 | 3.14 | 512 | 1.04 | α | 0.97 | β | β |
| Example 24 | 0.2 | 0.9 | 0.03 | 179.09 | 2.69 | 24.42 | 69.67 | 1.72 | 3.22 | 516 | 1.02 | β | 0.95 | α | β |

FIG. 7

(Table 3)

| | Lu(3-x-z)Mg$_x$Zn$_y$Al$_{(5-y)}$O$_{12}$:Ce$_z$ | | | Blending amount /g | | | | | | Peak wavelength (nm) | C | Determination | A/B | Determination | Comprehensive determination |
|---|---|---|---|---|---|---|---|---|---|---|---|---|---|---|---|
| | x | y | z | Lutetium oxide Lu$_2$O$_3$ | Magnesium oxide MgO | Zinc oxide ZnO | Alumina Al$_2$O$_3$ | Cerium oxide CeO$_2$ | Barium fluoride BaF$_2$ | | | | | | |
| Example 25 | 0.9 | 0.2 | 0.03 | 133.84 | 12.09 | 5.43 | 81.57 | 1.72 | 2.73 | 518 | 1.04 | β | 0.96 | α | β |
| Example 26 | 0.4 | 1.4 | 0.03 | 166.16 | 5.37 | 37.99 | 61.18 | 1.72 | 3.16 | 518 | 1.01 | β | 0.96 | α | β |
| Example 27 | 0.4 | 0.4 | 0.03 | 166.16 | 5.37 | 10.85 | 78.17 | 1.72 | 3.05 | 519 | 1.04 | β | 0.95 | α | β |
| Example 28 | 1.4 | 0.4 | 0.03 | 101.51 | 18.81 | 10.85 | 78.17 | 1.72 | 2.45 | 517 | 1.03 | β | 0.97 | α | β |
| Example 29 | 0.1 | 0.01 | 0.06 | 183.62 | 1.34 | 0.27 | 84.80 | 3.44 | 3.18 | 516 | 1.03 | β | 0.94 | β | β |
| Example 30 | 0.4 | 0.01 | 0.06 | 164.22 | 5.37 | 0.27 | 84.80 | 3.44 | 3.00 | 514 | 1.06 | α | 0.96 | α | α |
| Example 31 | 0.9 | 0.01 | 0.06 | 131.90 | 12.09 | 0.27 | 84.80 | 3.44 | 2.70 | 511 | 1.04 | β | 0.96 | α | β |
| Example 32 | 1.4 | 0.01 | 0.06 | 99.57 | 18.81 | 0.27 | 84.80 | 3.44 | 2.40 | 511 | 1.03 | β | 0.95 | α | β |
| Example 33 | 0.01 | 0.1 | 0.06 | 189.44 | 0.13 | 2.71 | 83.27 | 3.44 | 3.24 | 511 | 1.03 | α | 0.96 | α | α |
| Example 34 | 0.01 | 0.4 | 0.06 | 189.44 | 0.13 | 10.85 | 78.17 | 3.44 | 3.28 | 512 | 1.05 | α | 0.96 | α | α |
| Example 35 | 0.01 | 0.9 | 0.06 | 189.44 | 0.13 | 24.42 | 69.67 | 3.44 | 3.34 | 518 | 1.04 | β | 0.95 | α | β |
| Example 36 | 0.01 | 1.4 | 0.06 | 189.44 | 0.13 | 37.99 | 61.18 | 3.44 | 3.39 | 519 | 1.05 | α | 0.93 | β | β |
| Example 37 | 0.2 | 0.2 | 0.06 | 177.15 | 2.69 | 5.43 | 81.57 | 3.44 | 3.14 | 517 | 1.04 | β | 0.94 | β | β |
| Comparative example 1 | 0.2 | 0.9 | 0.06 | 177.15 | 2.69 | 24.42 | 69.67 | 3.44 | 3.22 | 520 | — | γ | 0.95 | α | γ |
| Comparative example 2 | 0.9 | 0.2 | 0.06 | 131.90 | 12.09 | 5.43 | 81.57 | 3.44 | 2.72 | 521 | — | γ | 0.94 | β | γ |
| Comparative example 3 | 0.4 | 1.4 | 0.06 | 164.22 | 5.37 | 37.99 | 61.18 | 3.44 | 3.16 | 520 | — | γ | 0.95 | α | γ |
| Comparative example 4 | 0.4 | 0.4 | 0.06 | 164.22 | 5.37 | 10.85 | 78.17 | 3.44 | 3.04 | 522 | — | γ | 0.94 | β | γ |
| Comparative example 5 | 1.4 | 0.4 | 0.06 | 99.57 | 18.81 | 10.85 | 78.17 | 3.44 | 2.45 | 525 | — | γ | 0.93 | β | γ |
| Example 38 | 0.1 | 0.01 | 0.09 | 181.68 | 1.34 | 0.27 | 84.80 | 5.16 | 3.17 | 519 | 1.04 | β | 0.95 | α | β |
| Example 39 | 0.4 | 0.01 | 0.09 | 162.28 | 5.37 | 0.27 | 84.80 | 5.16 | 3.00 | 519 | 1.03 | β | 0.96 | α | β |
| Example 40 | 0.9 | 0.01 | 0.09 | 129.96 | 12.09 | 0.27 | 84.80 | 5.16 | 2.70 | 520 | 1.05 | α | 0.94 | β | β |
| Comparative example 6 | 1.4 | 0.01 | 0.09 | 97.63 | 18.81 | 0.27 | 84.80 | 5.16 | 2.40 | 521 | — | γ | 0.95 | α | γ |
| Example 41 | 0.01 | 0.1 | 0.09 | 187.50 | 0.13 | 2.71 | 83.27 | 5.16 | 3.24 | 520 | 1.02 | β | 0.94 | β | β |
| Example 42 | 0.01 | 0.4 | 0.09 | 187.50 | 0.13 | 10.85 | 78.17 | 5.16 | 3.27 | 519 | 1.01 | β | 0.94 | β | β |

FIG. 8

(Table 4)

| | $Lu_{(3-x-z)}Mg_xZn_yAl_{(5-y)}O_{12}:Ce_z$ | | | Blending amount /g | | | | | | Peak wave-length (nm) | C | Determination | A/B | Determination | Compre-hensive determination |
|---|---|---|---|---|---|---|---|---|---|---|---|---|---|---|---|
| | x | y | z | Lutetium oxide $Lu_2O_3$ | Magnesium oxide MgO | Zinc oxide ZnO | Alumina $Al_2O_3$ | Cerium oxide $CeO_2$ | Barium fluoride $BaF_2$ | | | | | | |
| Example 43 | 0.01 | 0.9 | 0.09 | 187.50 | 0.13 | 24.42 | 69.67 | 5.16 | 3.33 | 520 | 1.03 | β | 0.93 | β | β |
| Comparative example 7 | 0.01 | 1.4 | 0.09 | 187.50 | 0.13 | 37.99 | 61.18 | 5.16 | 3.39 | 522 | — | γ | 0.94 | β | γ |
| Comparative example 8 | 0.2 | 0.2 | 0.09 | 175.22 | 2.69 | 5.43 | 81.57 | 5.16 | 3.14 | 525 | — | γ | 0.95 | α | γ |
| Comparative example 9 | 0.2 | 0.9 | 0.09 | 175.22 | 2.69 | 24.42 | 69.67 | 5.16 | 3.22 | 527 | — | γ | 0.96 | α | γ |
| Comparative example 10 | 0.9 | 0.2 | 0.09 | 129.96 | 12.09 | 5.43 | 81.57 | 5.16 | 2.72 | 523 | — | γ | 0.95 | α | γ |
| Comparative example 11 | 0.4 | 1.4 | 0.09 | 162.28 | 5.37 | 37.99 | 61.18 | 5.16 | 3.16 | 529 | — | γ | 0.94 | β | γ |
| Comparative example 12 | 0.4 | 0.4 | 0.09 | 162.28 | 5.37 | 10.85 | 78.17 | 5.16 | 3.04 | 530 | — | γ | 0.95 | α | γ |
| Comparative example 13 | 1.4 | 0.4 | 0.09 | 97.63 | 18.81 | 10.85 | 78.17 | 5.16 | 2.45 | 524 | — | γ | 0.96 | α | γ |
| Example 44 | 0.1 | 0.01 | 0.12 | 179.74 | 1.34 | 0.27 | 84.80 | 6.88 | 3.17 | 519 | 1.01 | β | 0.97 | α | β |
| Example 45 | 0.4 | 0.01 | 0.12 | 160.34 | 5.37 | 0.27 | 84.80 | 6.88 | 2.99 | 518 | 1.03 | β | 0.94 | β | β |
| Comparative example 14 | 0.9 | 0.01 | 0.12 | 128.02 | 12.09 | 0.27 | 84.80 | 6.88 | 2.70 | 521 | — | γ | 0.95 | α | γ |
| Comparative example 15 | 1.4 | 0.01 | 0.12 | 95.69 | 18.81 | 0.27 | 84.80 | 6.88 | 2.40 | 522 | — | γ | 0.96 | α | γ |
| Example 46 | 0.01 | 0.1 | 0.12 | 185.56 | 0.13 | 2.71 | 83.27 | 6.88 | 3.24 | 520 | 1.02 | β | 0.94 | β | β |
| Example 47 | 0.01 | 0.4 | 0.12 | 185.56 | 0.13 | 10.85 | 78.17 | 6.88 | 3.27 | 520 | 1.01 | β | 0.95 | α | β |
| Comparative example 16 | 0.01 | 0.9 | 0.12 | 185.56 | 0.13 | 24.42 | 69.67 | 6.88 | 3.33 | 521 | — | γ | 0.89 | γ | γ |
| Comparative example 17 | 0.01 | 1.4 | 0.12 | 185.56 | 0.13 | 37.99 | 61.18 | 6.88 | 3.39 | 523 | — | γ | 0.9 | β | γ |
| Comparative example 18 | 0.2 | 0.2 | 0.12 | 173.28 | 2.69 | 5.43 | 81.57 | 6.88 | 3.13 | 521 | — | γ | 0.88 | γ | γ |
| Comparative example 19 | 0.2 | 0.9 | 0.12 | 173.28 | 2.69 | 24.42 | 69.67 | 6.88 | 3.22 | 522 | — | γ | 0.89 | γ | γ |
| Comparative example 20 | 0.9 | 0.2 | 0.12 | 128.02 | 12.09 | 5.43 | 81.57 | 6.88 | 2.72 | 523 | — | γ | 0.9 | β | γ |
| Comparative example 21 | 0.4 | 1.4 | 0.12 | 160.34 | 5.37 | 37.99 | 61.18 | 6.88 | 3.16 | 522 | — | γ | 0.89 | γ | γ |
| Comparative example 22 | 0.4 | 0.4 | 0.12 | 160.34 | 5.37 | 10.85 | 78.17 | 6.88 | 3.04 | 525 | — | γ | 0.9 | β | γ |
| Comparative example 23 | 1.4 | 0.4 | 0.12 | 95.69 | 18.81 | 10.85 | 78.17 | 6.88 | 2.44 | 527 | — | γ | 0.88 | γ | γ |

PHOSPHOR AND SEMICONDUCTOR LIGHT EMITTING DEVICE USING THE SAME

BACKGROUND

1. Technical Field

The present disclosure relates to a phosphor that absorbs a bluish excitation light and emits blue-greenish fluorescence. In particular, it relates more specifically to a phosphor that is desirably used for imparting a color rendering property to a light source for illumination. The present disclosure also relates to a semiconductor light emitting device for a white light source using the phosphor.

2. Description of the Related Art

As a technique for obtaining a white light source, for example, a technique using a semiconductor light emitting element represented by a gallium nitride (GaN)-based blue light emitting diode and a phosphor such as YAG:Ce in combination has been known so far (see, for example, Patent No. JP02900928B). The phosphor such as YAG:Ce is excited by an excitation light such as an ultraviolet ray or blue light emitted from the semiconductor light emitting element, and emits yellowish fluorescence having a longer wavelength. At this time, white light can be obtained by combining the unabsorbed excitation light with a yellowish fluorescence. Since having a long service life and low power consumption, such a semiconductor light emitting device for a white light source is becoming mainstream as an image display device and a light source for illumination.

However, there is a problem that the white light, which is formed of the yellowish fluorescence and the unabsorbed blue light that serves as a complementary color thereof, may be lacking in the color rendering property. For example, blue-green light or green light having a wavelength between that of the blue light that is the excitation light and that of the yellow light that is the fluorescence, is insufficient. In order to impart the insufficient color rendering property, various phosphors have been proposed so far, such as a cerium-activated calcium sulfide (CaS:Ce) phosphor that is an alkaline earth metal sulfide having a rock salt type crystal structure, a phosphor of $(Sr, Ba)_2Si_4:Eu^{2+}$ that is an alkaline earth metal orthosilicate having divalent europium activated, a phosphor of $(Y, Sm)_3(Al, Ga)_5O_{12}:Ce$, which is obtained by substituting a part of aluminum with Ga, in a known YAG:Ce phosphor obtained by having cerium activated in yttrium aluminum garnet (for example, see Japanese Patent Unexamined Publication No. 10-242513), or similarly, a phosphor obtained by substituting a part of yttrium with Lu, in the YAG:Ce phosphor (for example, see International Publication No. 2012/046642).

SUMMARY

A phosphor according to an aspect of the present disclosure is represented by a chemical formula of $Lu_{(3-x-z)}Mg_xZn_yAl_{(5-y)}O_{12}:Ce_z$, wherein in a case where z is in a range of $0.01 \leq z \leq 0.03$, x and y respectively satisfy $0 < x \leq 1.4$ and $0 < y \leq 1.4$, in a case where z is in a range of $0.03 < z \leq 0.06$, x and y respectively satisfy $y < 0.2$ and $0.1 \leq x \leq 1.4$, $x < 0.2$ and $0.1 \leq y \leq 1.4$, or $x = 0.2$ and $y = 0.2$, in a case where z is in a range of $0.06 < z \leq 0.09$, x and y respectively satisfy $y < 0.2$ and $0.1 \leq x < 1.4$, or $x < 0.2$ and $0.1 \leq y < 1.4$, and in a case where z is in a range of $0.09 < z \leq 0.12$, x and y respectively satisfy $y < 0.2$ and $0.1 \leq x < 0.9$, or $x < 0.2$ and $0.1 \leq y < 0.9$.

DETAILED DESCRIPTIONS

For example, when a high output excitation light such as a blue laser is applied as an excitation light source to implement a high luminance light source, there is a problem that it is difficult for these phosphors in the related art to realize a high luminance light source in aspects of chemical stability, light emission luminance, or light emission luminance at a high temperature. Further, there may be a problem that a blue-green light emitting component is insufficient even when the light emission luminance at a high temperature is sufficient.

In the future, it is considered that there will be a demand for a phosphor that has a shorter light emission peak wavelength and is closer to blue, due to market needs of a high color rendering light source in high luminance light sources or laser excitation projectors. Further, the light emission luminance is desired to be less decreased at a high temperature.

In order to solve the above problems, an object of the present disclosure is to provide a phosphor that is suitable for a blue excitation light source with a low decrease in light emission luminance at a high temperature.

A phosphor according to a first aspect is represented by a chemical formula of $Lu_{(3-x-z)}Mg_xZn_yAl_{(5-y)}O_{12}:Ce_z$, wherein in a case where z is in a range of $0.01 \leq z \leq 0.03$, x and y respectively satisfy $0 < x \leq 1.4$ and $0 < y \leq 1.4$, in a case where z is in a range of $0.03 < z \leq 0.06$, x and y respectively satisfy $y < 0.2$ and $0.1 \leq x \leq 1.4$, $x < 0.2$ and $0.1 \leq y \leq 1.4$, or $x=0.2$ and $y=0.2$, in a case where z is in a range of $0.06 < z \leq 0.09$, x and y respectively satisfy $y < 0.2$ and $0.1 \leq x < 1.4$, or $x < 0.2$ and $0.1 \leq y < 1.4$, and in a case where z is in a range of $0.09 < z \leq 0.12$, x and y respectively satisfy $y < 0.2$ and $0.1 \leq x < 0.9$, or $x < 0.2$ and $0.1 \leq y < 0.9$.

The phosphor according to a second aspect, in the first aspect, in a case where z is in a range of $0.01 \leq z \leq 0.03$, x and y respectively satisfy $y < 0.2$ and $0.1 \leq x \leq 1.4$, or $x < 0.2$ and $0.1 \leq y \leq 1.4$, and in a case where z is in a range of $0.03 < z \leq 0.06$, x and y respectively satisfy $y < 0.2$ and $0.1 < x < 0.9$, or $x < 0.2$ and $0.1 < y < 0.9$.

A semiconductor light emitting device according to a third aspect includes the phosphor according to the first or second aspect, and a semiconductor light emitting element that emits blue light having a light emission peak wavelength of 450 nm.

According to the above configuration, it is possible to provide an efficient semiconductor light emitting device for a white light source with an excellent color rendering property and low luminance decrease at high output for having a low luminance decrease at a high temperature.

More specifically, the phosphor according to the present disclosure has a light emission peak wavelength of 500 nm or more and 520 nm or less, exhibits a high color rendering property in a short wavelength region within a visible wavelength region, and shows a low decrease in light emission luminance at a high temperature. Therefore, it is possible to obtain an excellent semiconductor light emitting device for a white light source that has a high color rendering property and low luminance decrease at a high temperature in the combination of the phosphor and a semiconductor light emitting element that emits blue light and has a light emission peak wavelength of 450 nm, for example.

Hereinafter, a phosphor according to Exemplary Embodiment will be described with reference to the drawings. In the drawings, substantially the same members are denoted by the same reference numerals.

Exemplary Embodiment 1

A phosphor according to Exemplary Embodiment 1 is represented by a chemical formula of $Lu_{(3-x-z)}Mg_xZn_yAl_{(5-y)}O_{12}:Ce_z$. The phosphor has $Lu_3Al_5O_{12}$ having a garnet structure as a mother crystal, contains Mg as a metal element that substitutes a part of Lu, contains Zn as a metal element that substitutes a part of Al, and contains Ce as a light emission center element that substitutes a part of Lu. The contents of Mg, Zn, and Ce are represented by indices x, y, and z, respectively. A range of each index is shown for the following four cases with respect to a range of the index z representing the contents of Ce.

i) In a case where z is in a range of $0.01 \leq z \leq 0.03$, x and y respectively satisfy $0 < x \leq 1.4$ and $0 < y \leq 1.4$.

ii) In a case where z is in a range of $0.03 < z \leq 0.06$, x and y respectively satisfy $y < 0.2$ and $0.1 \leq x \leq 1.4$, $x < 0.2$ and $0.1 \leq y \leq 1.4$, or $x=0.2$ and $y=0.2$.

iii) In a case where z is in a range of $0.06 < z \leq 0.09$, x and y respectively satisfy $y < 0.2$ and $0.1 \leq x < 1.4$, or $x < 0.2$ and $0.1 \leq y < 1.4$.

iv) In a case where z is in a range of $0.09 < z \leq 0.12$, x and y respectively satisfy $y < 0.2$ and $0.1 \leq x < 0.9$, or $x < 0.2$ and $0.1 \leq y < 0.9$.

Figure 1:
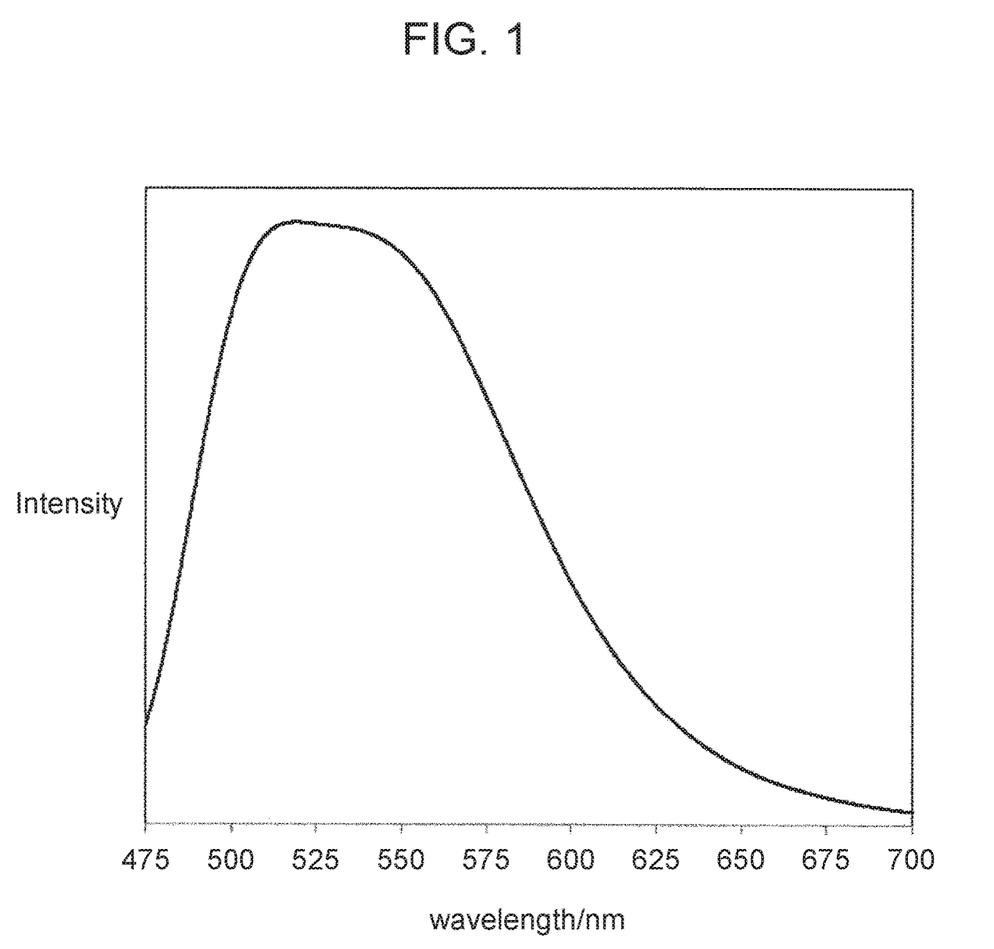
FIG. 1 illustrates a fluorescence spectrum of an example (for example, Example 3) of a phosphor according to Exemplary Embodiment 1.

According to the phosphor, as illustrated in the fluorescence spectrum in FIG. 1, the phosphor has a light emission peak wavelength of 500 nm or more and 520 nm or less, exhibits a high color rendering property in a short wavelength region within a visible wavelength region, and shows a low decrease in light emission luminance at a high temperature. Therefore, it is possible to obtain an excellent semiconductor light emitting device for a white light source that has a high color rendering property and low luminance decrease at a high temperature in the combination of the phosphor and a semiconductor light emitting element that emits blue light and has a light emission peak wavelength of 450 nm, for example.

Method for Producing Phosphor

Hereinafter, each step of a method for producing the phosphor according to Exemplary Embodiment 1 will be described.

(1) As raw materials, oxides, for example, of lutetium (Lu), aluminum (Al), magnesium (Mg), and zinc (Zn), which are elements constituting a mother crystal, can be used. As the oxides of the raw materials, lutetium oxide, alumina, magnesium oxide, and zinc oxide are prepared, and further, a cerium oxide is prepared as a raw material of cerium (Ce) serving as an activator. At least one of magnesium oxide and zinc oxide may be prepared, or both may be prepared. Further, the raw materials may also be metal salt compounds including carbonates and the like, instead of the oxides.

(2) A predetermined amount of powders of the raw material is weighed and thoroughly mixed. For example, a mixing device such as a ball mill can be used for mixing the powders. Alternatively, or the powders can be mixed manually using a mortar or the like. Barium fluoride ($BaF_2$) or strontium fluoride ($SrF_2$) as a flux corresponding to 0.1 weight % to 10 weight % of the mixed powder can be mixed.

Although the mixed powder is obtained by dry mixing as described above, the mixing is not limited thereto and may be wet mixing. Further, the mixed powder of the raw materials may be obtained by a precipitation reaction, a sol-gel method, or the like.

(3) Next, the mixed powder prepared as described above is calcined. For example, an electric furnace can be used for calcining the mixed powder. The mixed powder is put into, for example, a crucible made of alumina, and is heated together with the alumina crucible at 1200° C. or higher and 1600° C. or lower for substantially 3 hours or more and 12 hours or less and calcined.

(4) After the calcining, the phosphor powder can be obtained through steps such as cooling, crushing, and flux washing with an acid as desired.

Semiconductor Light Emitting Device for White Light Source

Figure 3:
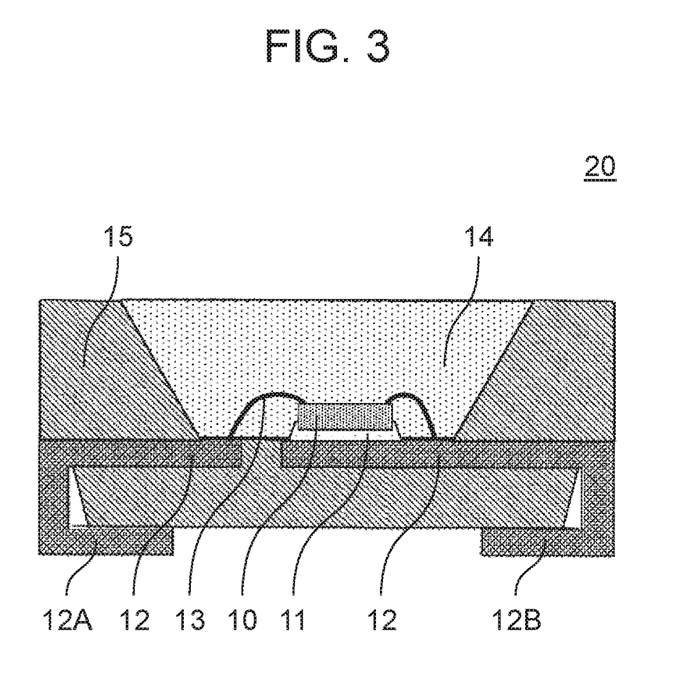
FIG. 3 is a schematic cross-sectional view illustrating an example (for example, Example 48) of a semiconductor light emitting device for a white light source that uses the phosphor according to Exemplary Embodiment 1.

FIG. 3 is a schematic cross-sectional view illustrating a structure of semiconductor light emitting device for a white light source 20 according to Exemplary Embodiment 1. Semiconductor light emitting device for a white light source 20 includes lead frame 12 that at least has lead portions 12A and 12B, resin container 15 that has a recessed portion, semiconductor element 10 that is disposed on an inner side of resin container 15 and that is mounted on lead portion 12B via publicly known die bonding material 11, metal wire 13 that electrically couples semiconductor element 10 and lead portions 12A and 12B, and phosphor-containing sealing resin 14.

Hereinafter, each member which constitutes semiconductor light emitting device for a white light source 20 will be described.

Semiconductor Element (Semiconductor Light Emitting Device)

Semiconductor element 10 is bonded by paste material 11 so as to be mounted on lead portion 12B at a place positioned on a bottom surface of the recessed portion of resin container 15. Further, a p-type electrode is coupled to lead portion 12A used for an anode via metal wire 13, and an n-type electrode is coupled to lead portion 12B used for a cathode via metal wire 13.

Semiconductor element 10 may be any light emitting element and is not particularly limited. In the present exemplary embodiment, for example, semiconductor element 10 includes a seed layer made of AlN formed on a sapphire substrate, a base layer formed on the seed layer, and a laminated semiconductor layer mainly made of GaN. Semiconductor element 10 has, for example, a light emission wavelength region of 430 nm or more and 500 nm or less.

Lead Frame

Lead frame 12 is made of a material having excellent thermal conductivity and electrical conductivity, such as copper, and a silver plated layer is formed on a surface thereof by applying silver plating. Therefore, at least a part of the silver plated layer on lead portions 12A and 12B is exposed to the bottom surface of the recessed portion of resin container 15. The silver plated layer can be formed by using a publicly known silver plating method.

Lead Portion

As illustrated in FIG. 3, in order to make the semiconductor light emitting device for a white light source correspond to surface mounting, lead portions 12A and 12B have a structure of being bent to a back side of resin container 15, and tip ends of lead portions 12A and 12B are disposed on the back side of resin container 15.

Resin Container

Resin container 15 is formed by molding a publicly known thermoplastic resin such as acrylic resin, polyvinyl chloride, polyphenylene sulfide, polyvinylidene chloride, polyamide, polycarbonate, polytetrafluoroethylene, polystyrene, polyurethane, ABS resin, liquid crystal polymer, polyacetal resin, or epoxy resin, or a thermosetting resin, in all of which a white pigment is blended, in a shape to hold lead portions 12A and 12B, and among these resins, polyamide, liquid crystal polymer, epoxy resin, polystyrene, and nylon can be suitably used. Further, the resin for forming resin container 15 is blended with a white pigment, and the content, a particle size, and the like of the white pigment are adjusted such that a light reflectance of a visible light is 85% or more and 98% or less. Examples of the white pigment include, but are not limited to, zinc oxide, white lead, lithopone, titania (titanium oxide), aluminum oxide, precipitated barium sulfate, and a barite powder. In particular, the titanium oxide can be suitably used from the viewpoint of a high refractive index and a low light absorptivity. Further, in order to efficiently use light which is emitted from semiconductor element 10, silver plating may be applied to a surface of the recessed portion.

Phosphor-Containing Sealing Resin

Next, phosphor-containing sealing resin 14 will be described. Phosphor-containing sealing resin 14 is constituted by the phosphor and the resin according to the present exemplary embodiment. As the resin, a transparent resin in the visible region can be used, but it is not limited to this, and examples thereof include a silicone resin, an epoxy resin, and an acrylic resin. Among these resins, the silicone resin can be suitably used from the viewpoint of light resistance and heat resistance.

In particular, by blending the phosphor according to the present exemplary embodiment in phosphor-containing sealing resin 14 which is described above, the white light exhibits a high color rendering property including light emission in the short wavelength region of the blue-green light.

That is, at least one kind of the phosphor according to Exemplary Embodiment 1 may be contained in phosphor-containing sealing resin 14. Further, a mixture of a nitride-based phosphor known as a $CaAlSiN_3$-based phosphor that emits light in a red region, a sulfide-based phosphor, and a YAG:Ce phosphor that is a yellow light emitting phosphor may be used additionally. Further, it is possible to appropriately select the kind of the phosphor in order to adjust a light color to a desired emission light color.

The structure of the semiconductor light emitting device for a white light source is not limited to that described above, and it may be any structure as long as light emitted from semiconductor element 10 excites the phosphor according to the exemplary embodiment to obtain white light having a high color rendering property.

Hereinafter, examples and comparative Examples will be specifically described.

Examples 1 to 48, Comparative Examples 1 to 23

Figure 6:
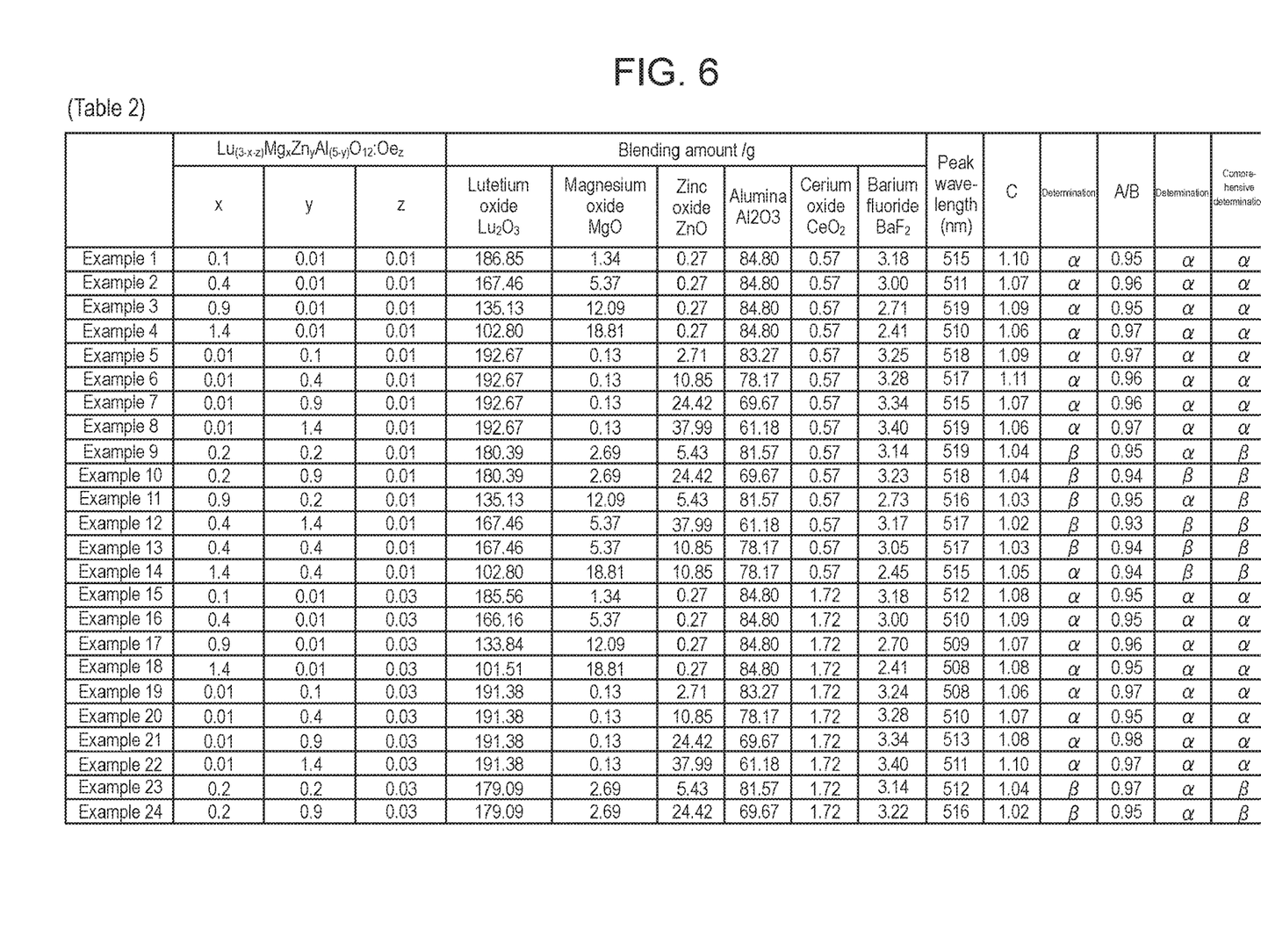
FIG. 6 is Table 2 illustrating blending amounts and evaluation results of Examples 1 to 24.
Figure 7:
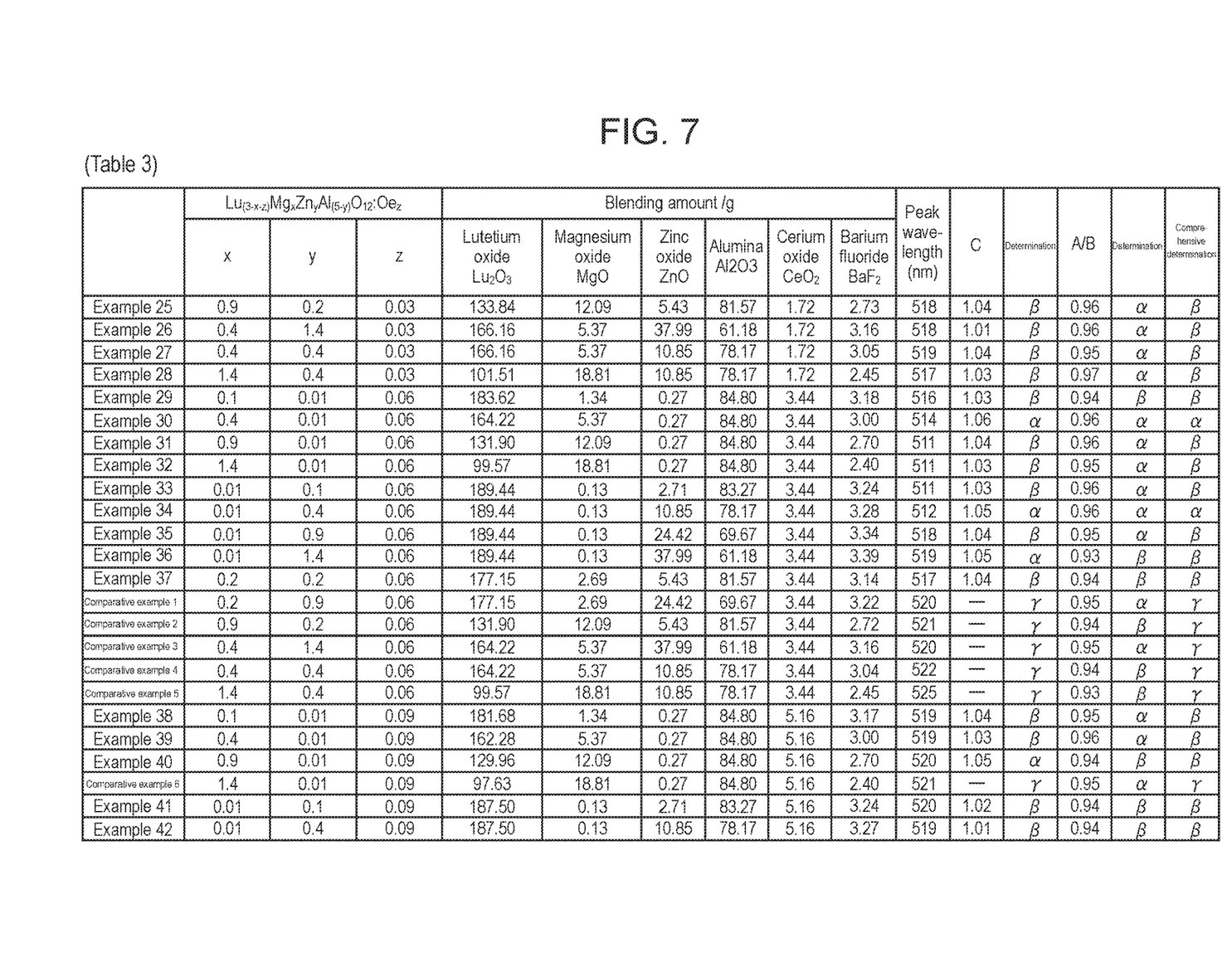
FIG. 7 is Table 3 illustrating blending amounts and evaluation results of Examples 25 to 42 and Comparative Examples 1 to 6.
Figure 8:
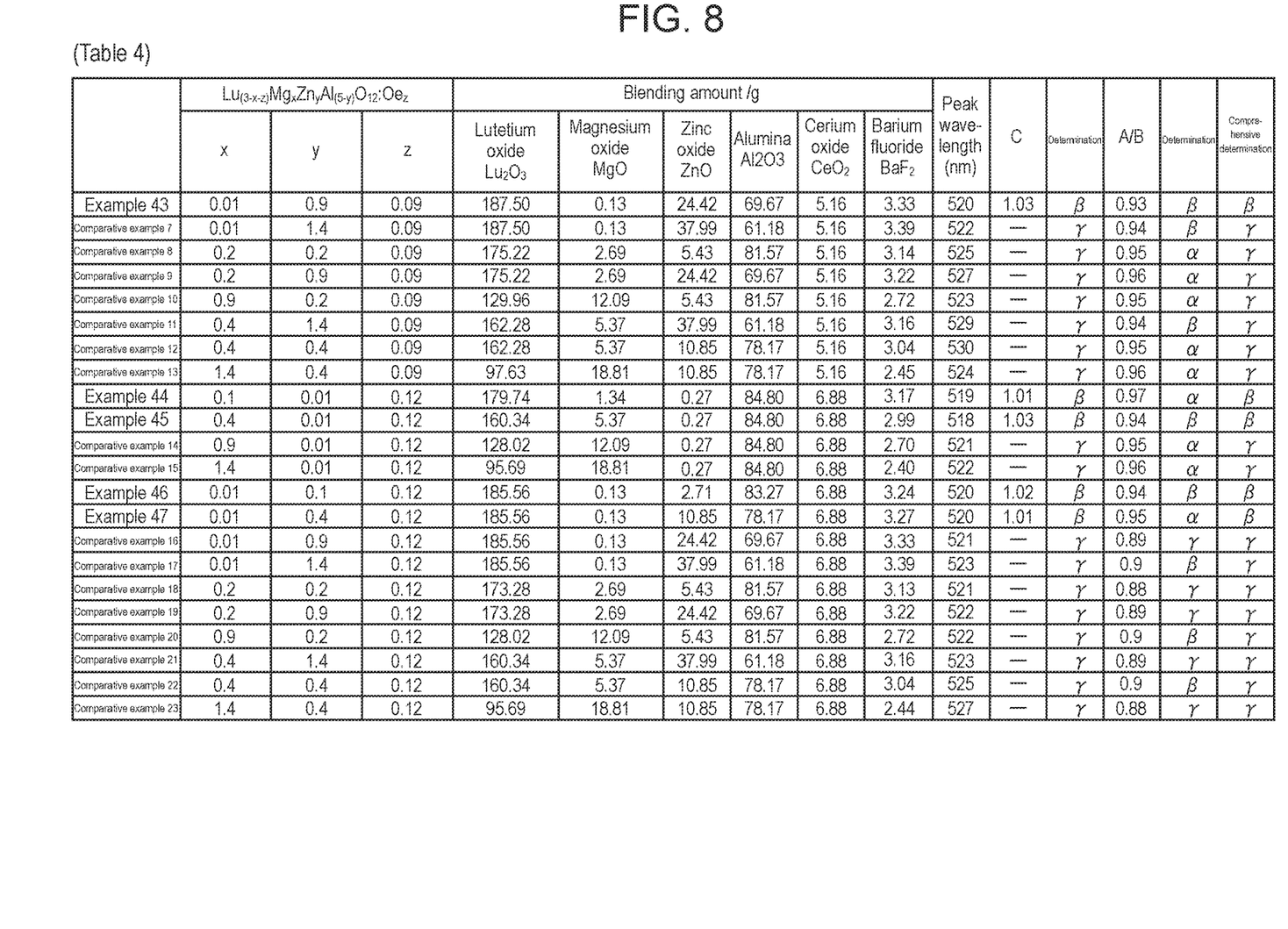
FIG. 8 is Table 4 illustrating blending amounts and evaluation results of Examples 43 to 47 and Comparative Examples 7 to 23.

In respect of Examples 1 to 48 and Comparative Examples 1 to 23, the raw materials were mixed in accordance with blending amounts shown in Table 2 in FIG. 6, Table 3 in FIG. 7, and Table 4 in FIG. 8, and were calcined to obtain a phosphor.

Hereinafter, Example 3 will be described as a representative example.

Example 3

(1) As the raw materials, 135.13 g of a lutetium oxide ($Lu_2O_3$) powder, 12.09 g of a magnesium oxide (MgO) powder, 0.27 g of a zinc oxide (ZnO), 84.80 of an alumina ($Al_2O_3$) powder, 0.57 g of a cerium oxide ($CeO_2$) powder, and 2.71 g of a barium fluoride powder were weighed and put into one container. The barium fluoride was a flux.

(2) These raw materials were thoroughly mixed. A device such as a ball mill can be used for mixing.

(3) The mixture was put into an alumina crucible and calcined at 1300° C. for substantially 5 hours in an electric furnace at a nitrogen atmosphere.

In this way, regarding the phosphor that can be represented by the chemical formula of $Lu_{(3-x-z)}Mg_xZn_yAl_{(5-y)}O_{12}:Ce_z$, according to the present Example 3, it is possible to obtain a phosphor in which x is 0.9, y is 0.01, and z is 0.01.

Figure 2A:
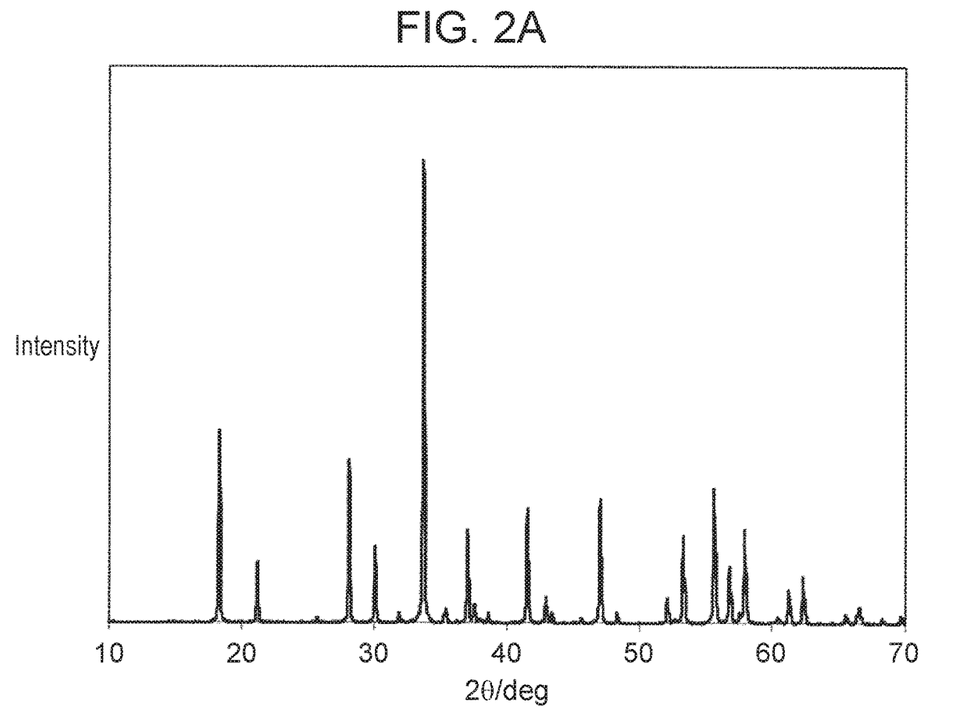
FIG. 2A illustrates a powder X-ray diffraction profile of the example (for example, Example 3) of the phosphor according to Exemplary Embodiment 1.
Figure 2B:
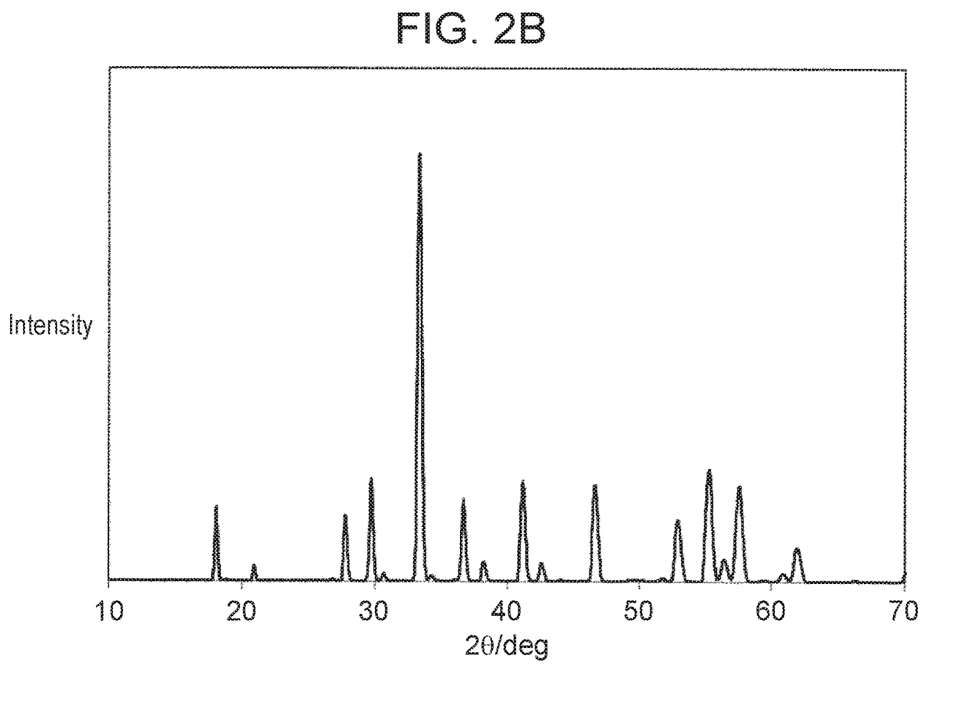
FIG. 2B illustrates a powder X-ray diffraction profile of a YAG:Ce phosphor.

A fluorescence spectrum of Example 3 which is obtained at the time of excitation with the blue light of 450 nm is illustrated in FIG. 1, and a powder X-ray diffraction profile of a synthesized phosphor powder is illustrated in FIG. 2A. It can be seen from FIG. 1 that the phosphor in Example 3 has a peak wavelength smaller than 520 nm and has high intensity light emission in a blue-green region. By comparing the X-ray diffraction profile in FIG. 2A with an X-ray diffraction profile of a publicly known phosphor YAG:Ce having a garnet structure in FIG. 2B, it can be seen that main peak positions in the X-ray diffraction profile in FIG. 2A coincide with those of the X-ray diffraction profile of the garnet structure crystal in FIG. 2B, but peak height ratios thereof are different, and that the phosphor in Example 3 has a crystal structure that is similar to the garnet structure but does not completely coincide therewith. Such a characteristic X-ray diffraction profile indicates distortion of the crystal structure from the garnet structure, which characterizes light emission characteristics in Example 3. Positions of main peaks and relative intensity of peak positions in the X-ray diffraction profiles according to FIGS. 2A and 2B are shown in Table 1 in FIG. 5.

Figure 5:
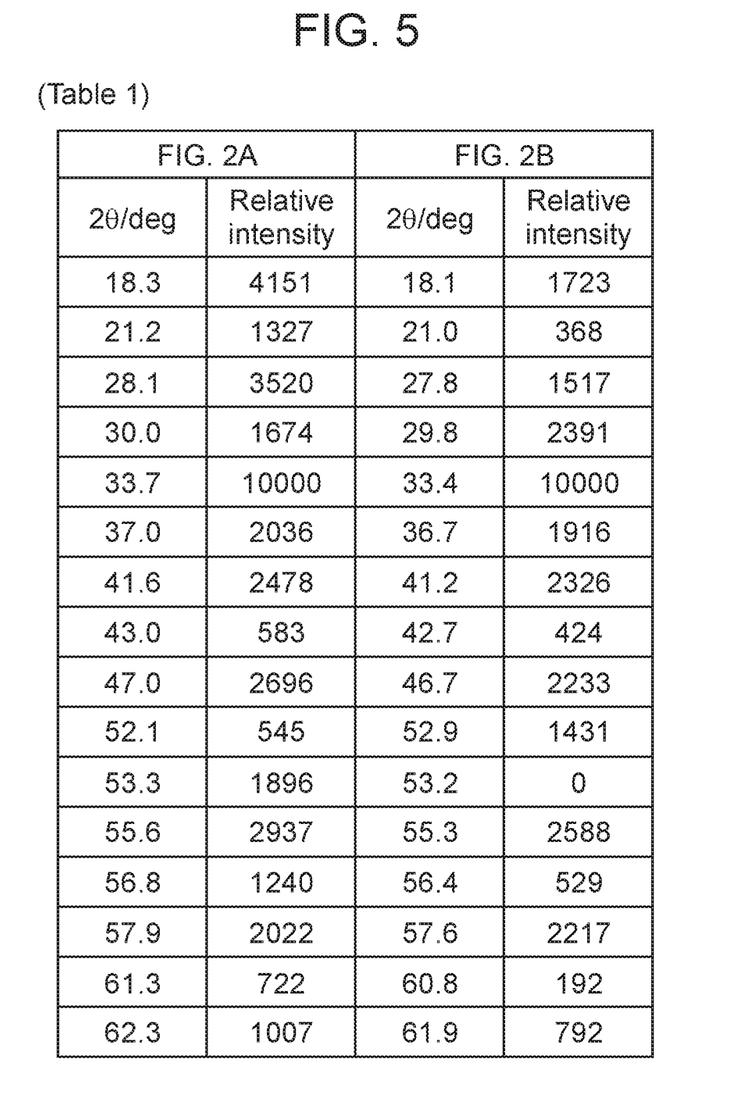
FIG. 5 is Table 1 illustrating positions of main peaks and relative intensity of peak positions of the X-ray diffraction profiles in FIGS. 2A and 2B.

According to Table 1 in FIG. 5, even though there is a small difference in peak position due to a measurement error in the X-ray diffraction profile of the phosphor in Example 3, it can be seen that the phosphor has characteristics such as the height of a peak at 2θ of 28.1 degrees and the height of a peak at 2θ of 30.0 degrees are different from the height of a peak at 2θ of 27.8 degrees and the height of a peak at 2θ of 29.8 degrees in a case of YAG:Ce, and having a peak at a position of 53.3 degrees which is not seen in the case of YAG:Ce.

Examples 1 and 2, Examples 4 to 47, and Comparative Examples 1 to 23

Examples 1 and 2, 4 to 47 and Comparative Examples 1 to 23 are similar to Example 3, except that the raw materials were prepared in accordance with blending amounts shown in Table 2 in FIG. 6, Table 3 in FIG. 7, and Table 4 in FIG. 8 to produce the phosphor, and that the respective values of x, y, and z in the chemical formula of $Lu_{(3-x-z)}Mg_xZn_yAl_{(5-y)}O_{12}:Ce_z$ which can represent the phosphor were shown in Table 2 in FIG. 6, Table 3 in FIG. 7, and Table 4 in FIG. 8.

The light emission characteristics in the blue-green region (500 nm to 520 nm) and the external quantum efficiency retention ratios at a high temperature were evaluated for Examples 1 to 47 and Comparative Examples 1 to 23 described above.

Respective evaluation methods and determination criteria thereof will be described below.
Light Emission Characteristics in Blue-Green Region (500 nm to 520 nm)

The fluorescence spectrum and external quantum efficiency of each of the synthesized phosphors in the examples and the comparative examples were measured with a spectrofluorometer (hereinafter referred to as a spectrofluorometer) using an integrating sphere. The synthesized phosphor was put into an aluminum container having a diameter of 5 mm and a depth of 2 mm, and then the aluminum container was placed at a predetermined position in an integrating sphere. A powder of the synthesized phosphor was irradiated with the blue light of 450 nm emitted from a blue LED light source attached to a measurement device to measure the fluorescence spectrum.
Determination Criteria
Light Emission Characteristics in Blue-Green Region (500 nm to 520 nm)

In the fluorescence spectrum, in a case where a light emission peak wavelength was 500 nm or more and 520 nm or less, and a value C obtained by dividing a light emission intensity at the light emission peak wavelength by a light emission intensity at 555 nm was 1.05 or more, it was denoted by "a" indicating that the light emission characteristics of the phosphor were particularly excellent in the blue-green region.

In the fluorescence spectrum, in a case where the light emission peak wavelength was 500 nm or more and 520 nm or less, and the value C obtained by dividing the light emission intensity at the light emission peak wavelength by the light emission intensity at 555 nm was less than 1.05, it was denoted by "ß" indicating that the light emission characteristics of the phosphor were excellent in the blue-green region.

In the fluorescence spectrum, in a case where the light emission peak wavelength was larger than 520 nm, it was denoted by "γ" indicating that the light emission characteristics of the phosphor were insufficient in the blue-green region.

External Quantum Efficiency Retention Ratio at High Temperature

The external quantum efficiency retention ratio at a high temperature, of each of the synthesized phosphors in the examples and the comparative examples, was measured using the following method. The above spectrofluorometer and the synthesized phosphor were put into an aluminum container having a diameter of 5 mm and a depth of 2 mm, and then the aluminum container was placed on a plate capable of heating the aluminum container. The aluminum container was placed at a predetermined position in an integrating sphere in a state where the aluminum container is heated to 150° C., and the powder of the synthesized phosphor was irradiated with the blue light of 450 nm emitted from a blue LED light source attached to a measurement device to measure the quantum efficiency. A measurement value was set as external quantum efficiency A at a high temperature. Next, a value of external quantum efficiency B at 25° C. was used without heating to 150° C., and A/B was set as an external quantum efficiency retention ratio at a high temperature.
Determination Criteria In a case where A/B was 0.95 or more, it was denoted by "a" as a range in which the external quantum efficiency retention ratio at a high temperature was particularly high.

In a case where A/B was 0.9 or more and less than 0.95, it was denoted by "ß" as a range in which the external quantum efficiency retention ratio at a high temperature was high.

In a case where A/B was less than 0.9, it was denoted by "γ" as a range in which the external quantum efficiency retention ratio at a high temperature was low.
Comprehensive Determination In respect of the determination results of the light emission characteristics in the blue-green region and the external quantum efficiency retention ratio at a high temperature described above, a case where both were "α" was denoted by "α" indicating that the light emission characteristics in the blue-green region and the external quantum efficiency retention ratio at a high temperature are particularly excellent, a case where either of the determination results of both was "γ" was denoted by "γ" indicating that the light emission characteristics in the blue-green region or the external quantum efficiency retention ratio at a high temperature was bad, and other cases were denoted by "ß" indicating that the light emission characteristics in the blue-green region and the external quantum efficiency retention ratio at a high temperature are excellent.

As described above, the following can be known according to Examples 1 to 47 and Comparative Examples 1 to 23.

The following can be known according to Examples 1 to 28.

In a phosphor which can be represented by a chemical formula of $Lu_{(3-x-z)}Mg_xZn_yAl_{(5-y)}O_{12}:Ce_z$, it can be seen that in a case where z is in a range of $0.01 \leq z \leq 0.03$, and $0 < x \leq 1.4$ and $0 < y \leq 1.4$, the phosphor was excellent in the light emission characteristics in the blue-green region and the external quantum efficiency retention ratio at a high temperature. Further, it can be seen that, particularly in a range of $y < 0.2$ and $0.1 \leq x \leq 1.4$, or in a range of $x < 0.2$ and $0.1 \leq y \leq 1.4$, the phosphor was particularly excellent in the light emission characteristics in the blue-green region and the external quantum efficiency retention ratio at a high temperature.

The following can be known according to Examples 29 to 37 and Comparative Examples 1 to 5.

In a phosphor which can be represented by a chemical formula of $Lu_{(3-x-z)}Mg_xZn_yAl_{(5-y)}O_{12}:Ce_z$, it can be seen that in a case where z is in a range of $0.03 < z \leq 0.06$, in a range of $y < 0.2$ and $0.1 \leq x \leq 1.4$, in a range of $x < 0.2$ and $0.1 \leq y \leq 1.4$, or in a range of $x = 0.2$ and $y = 0.2$, the phosphor was excellent in the light emission characteristics in the blue-green region and the external quantum efficiency retention ratio at a high temperature. Further, it can be seen that, particularly in a range of $y < 0.2$ and $0.1 < x < 0.9$, or in a range of $x < 0.2$ and $0.1 < y < 0.9$, the phosphor was particularly excellent in the light emission characteristics in the blue-green region and the external quantum efficiency retention ratio at a high temperature.

The following can be known according to Examples 38 to 43 and Comparative Examples 6 to 13.

In a phosphor which can be represented by a chemical formula of $Lu_{(3-x-z)}Mg_xZn_yAl_{(5-y)}O_{12}:Ce_z$, it can be seen that in a case where z is in a range of $0.06 < z \leq 0.09$, in a range of $y < 0.2$ and $0.1 \leq x < 1.4$, or in a range of $x < 0.2$ and $0.1 \leq y < 1.4$, the phosphor was excellent in the light emission characteristics in the blue-green region and the external quantum efficiency retention ratio at a high temperature.

The following can be known according to Examples 44 to 47 and Comparative Examples 14 to 23.

In a phosphor which can be represented by a chemical formula of $Lu_{(3-x-z)}Mg_xZn_yAl_{(5-y)}O_{12}:Ce_z$, it can be seen that in a case where z is in a range of $0.09 < z \leq 0.12$, in a range of $y < 0.2$ and $0.1 \leq x < 0.9$, or in a range of $x < 0.2$ and $0.1 \leq y < 0.9$, the phosphor was excellent in the light emission characteristics in the blue-green region and the external quantum efficiency retention ratio at a high temperature.

Example 48

The present Example 48 is an example of a semiconductor light emitting device for a white light source which includes the phosphor according to the present example.

A production process of the semiconductor light emitting device for a white light source is not limited, and, for example, a method as to be described below can be used, and the phosphor and a production method thereof can be the same as in Example 3, for example.

FIGS. 4A to 4D are cross-sectional views illustrating steps of an assembly process of semiconductor light emitting device for a white light source 20 according to the present Example 48.

The production method will be described specifically below.

(1) Production of Phosphor

The production of the phosphor is similar to that of Example 3.

Figure 4A:
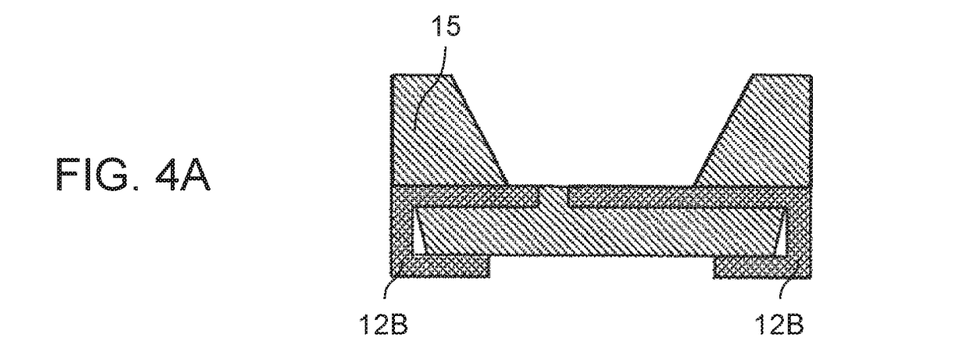
FIG. 4A is a cross-sectional view illustrating one step of a method for producing the example (for example, Example 48) of the semiconductor light emitting device for a white light source that uses the phosphor according to Exemplary Embodiment 1.
Figure 4B:
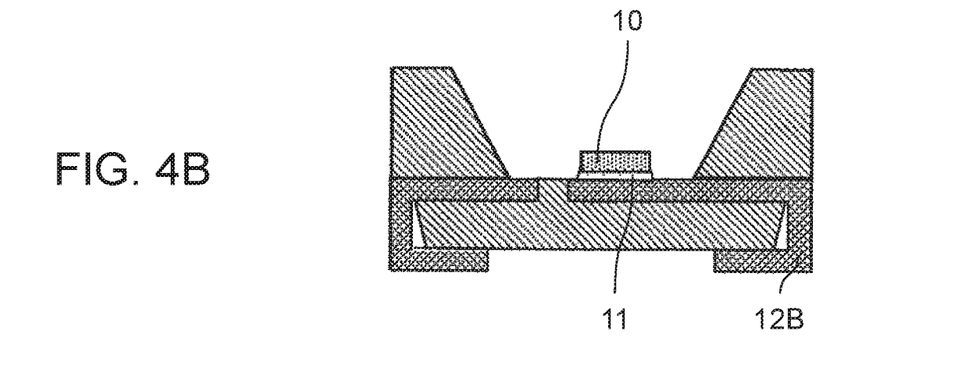
FIG. 4B is a cross-sectional view illustrating one step of the method for producing the example (for example, Example 48) of the semiconductor light emitting device for a white light source that uses the phosphor according to Exemplary Embodiment 1.
Figure 4C:
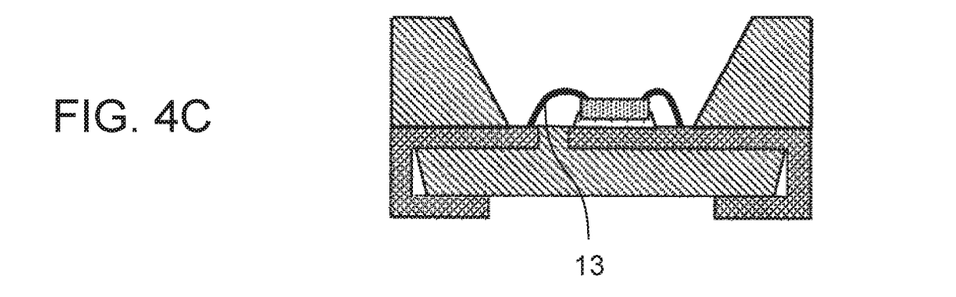
FIG. 4C is a cross-sectional view illustrating one step of the method for producing the example (for example, Example 48) of the semiconductor light emitting device for a white light source that uses the phosphor according to Exemplary Embodiment 1.
Figure 4D:
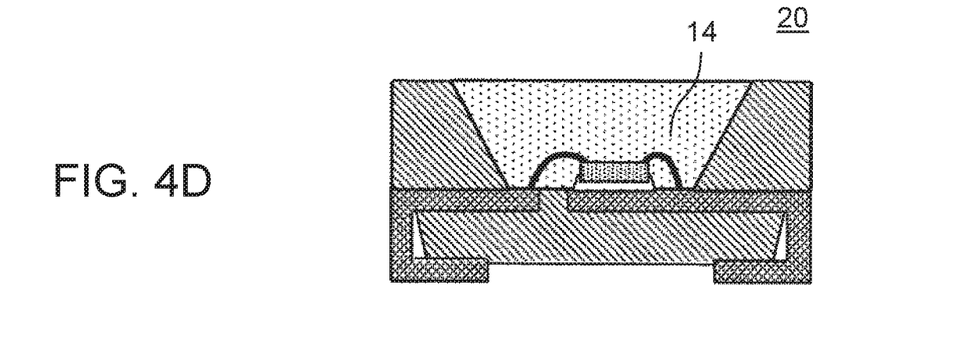
FIG. 4D is a cross-sectional view illustrating one step of the method for producing the example (for example, Example 48) of the semiconductor light emitting device for a white light source that uses the phosphor according to Exemplary Embodiment 1.

(2) Assembly of Members a) First, as illustrated in FIG. 4A, by injection molding of a white resin, resin container 15, in which a copper lead frame was disposed in a recessed portion thereof, was formed integrally with silver plated lead portion 12B of the lead frame. As the white resin, a titanium oxide-containing polycarbonate was used.

b) Next, as illustrated in FIG. 4B, on the lead frame on a bottom surface of the recessed portion of resin container 15, semiconductor element 10 was mounted, via publicly known paste material 11, on lead portion 12B used for a cathode, through die bonding and subsequent curing of the paste material according to a publicly known method.

c) Further, as illustrated in FIG. 4C, a p-type electrode and an n-type electrode of semiconductor element 10 were coupled to the corresponding lead portion 12A used for an anode and lead portion 12B used for the cathode respectively by using metal wire 13 with a publicly known wire bonding method.

d) Next, as illustrated in FIG. 4D, a mixture of an uncured silicone resin monomer and a mixed powder of the phosphor produced as above, a YAG:Ce phosphor, and a $CaAlSiN_3$-based phosphor were filled in an appropriate amount by a dispenser into the recessed portion of resin container 15. Thereafter, the mixture was cured through heating to form phosphor-containing sealing resin 14.

According to the above production process, the semiconductor light emitting device for a white light source in the present Example 48, which has an excellent color rendering property and a high retention ratio of light emission intensity at a high temperature, can be obtained.

Appropriate combinations of any of the exemplary embodiments and/or examples among the various exemplary embodiments and/or examples described above are within the scope of the present disclosure, and effects of the respective exemplary embodiments and/or examples can be achieved.

The phosphor according to the present disclosure has a light emission peak wavelength in a range of 500 nm or more and 520 nm or less, has a large light emission amount in the blue-green region, and show a low decrease in light emission amount in a high temperature environment. Therefore, when the phosphor is applied to a semiconductor light emitting element that emits blue light, a semiconductor light emitting device for a white light source which has an excellent color rendering property can be obtained. The semiconductor light emitting device for a white light source can be suitably used as a light source for illumination or a light source for liquid crystal backlight, and has high industrial utility value.

What is claimed is:

1. A phosphor of a chemical formula $Lu_{(3-x-z)}Mg_xZn_y Al_{(5-y)}O_{12}:Ce_z$, wherein
   in a case where z is in a range of $0.01 \leq z \leq 0.03$, x and y respectively satisfy $0 < x \leq 1.4$ and $0 < y \leq 1.4$,
   in a case where z is in a range of $0.03 < z \leq 0.06$, x and y respectively satisfy $y < 0.2$ and $0.1 \leq x \leq 1.4$, $x < 0.2$ and $0.1 \leq y \leq 1.4$, or $x = 0.2$ and $y = 0.2$,
   in a case where z is in a range of $0.06 < z \leq 0.09$, x and y respectively satisfy $y < 0.2$ and $0.1 \leq x < 1.4$, or $x < 0.2$ and $0.1 \leq y < 1.4$, and
   in a case where z is in a range of $0.09 < z \leq 0.12$, x and y respectively satisfy $y < 0.2$ and $0.1 \leq x < 0.9$, or $x < 0.2$ and $0.1 \leq y < 0.9$.

2. The phosphor of claim 1, wherein
   in a case where z is in a range of $0.01 \leq z \leq 0.03$, x and y respectively satisfy $y < 0.2$ and $0.1 \leq x \leq 1.4$, or $x < 0.2$ and $0.1 \leq y \leq 1.4$, and in a case where z is in a range of $0.03<z\leq0.06$, x and y respectively satisfy $y<0.2$ and $0.1<x<0.9$, or $x<0.2$ and $0.1<y<0.9$.

3. A semiconductor light emitting device comprising:

the phosphor of claim 1; and a semiconductor light emitting element that emits blue light having a light emission peak wavelength of 450 nm.

\* \* \* \* \*